United States Patent

Kimura

[11] Patent Number: 5,989,045
[45] Date of Patent: Nov. 23, 1999

[54] CARD CONNECTOR WHICH CAN PREVENT ERRONEOUS OPERATION OF AN EJECT BUTTON

[75] Inventor: Akira Kimura, Kokubunji, Japan

[73] Assignee: Japan Aviation Electronics Industry, Ltd., Tokyo, Japan

[21] Appl. No.: 09/086,763

[22] Filed: May 28, 1998

[30] Foreign Application Priority Data

Jun. 3, 1997 [JP] Japan ................................ 9-145440

[51] Int. Cl.[6] .................................................. H01R 13/62
[52] U.S. Cl. .............................................................. 439/159
[58] Field of Search .................................................. 439/159

[56] References Cited

U.S. PATENT DOCUMENTS 5,286,207  2/1994  McHugh ................................ 439/159

Primary Examiner—Steven L. Stephan
Assistant Examiner—Javaid Nasri
Attorney, Agent, or Firm—J. Warren Whitesel; Laff, Whitesel & Saret

[57] ABSTRACT

In a card connector (1) in which a card-shaped connection object (200) is loaded with movement thereof in a first direction and is unloaded with operation of a button (90) in the first direction, an inhibiting mechanism (63) inhibits movement of the button at a first position in the first direction only when the connection object is not loaded in the connector. The first position is determined between a second and a third position in the first direction.

12 Claims, 17 Drawing Sheets

5,989,045

CARD CONNECTOR WHICH CAN PREVENT ERRONEOUS OPERATION OF AN EJECT BUTTON

BACKGROUND OF THE INVENTION

The present invention relates to a connector for connecting a card-shaped connection object (hereinafter referred to as "card connector") and, in particular, to a card connector for allowing a PC card or the like to be inserted or loaded thereinto and released or unloaded therefrom.

A conventional card connector allows a card-shaped connection object, such as a PC card, to be loaded and unloaded in a first and a second direction. The card connector comprises a frame for receiving the connection object and an eject mechanism coupled to the frame and used for unloading the connection object. The eject mechanism comprises a button movable in the first and the second directions. The button is operated by an operator or operators to move in the first direction for causing the connection object be unloaded from the connector. When the connection object is loaded into the connector, the button is moved in the second direction.

In the conventional card connector, however, the button is projected to some degree and is further operable in either of the state wherein the connection object is loaded and the state wherein the connection object is not loaded. As a result, there has been a problem that a user may touch and operate the button in error.

SUMMARY OF THE INVENTION

It is therefore an object of the present invention to provide a card connector which can prevent the foregoing erroneous operation in the state wherein no connection object is loaded in the card connector.

Other object of the present invention will become clear as the description proceeds.

A card connector to which the present invention is applicable is for connecting a card-shaped connection object which is loaded into the connector in a first direction. The connector comprises a frame for receiving the connection object, a button coupled to the frame and operated to move in the first direction for causing the connection object to be unloaded from the connector, and a position control mechanism connected to the frame and the button for controlling a position of the button so that the button is cyclically movable among a first, a second, and a third position, the first position being between the second and the third positions in the first direction.

According to an aspect of this invention, there is provided a card connector which comprises a frame allowing a card-shaped connection object to be loaded thereinto and unloaded therefrom in given directions, a plate provided on the frame so as to be movable in the given directions and arranged to contact with the connection object, a lever provided on the frame so as to be turnable and coupled at one end thereof to the plate, and an eject mechanism coupled to the lever. In the card connector, the eject mechanism comprises a button movable along the given directions, an urging member connected to the button for urging the button so that a push-side end of the button projects from a given wall, an eject bar coupled to the frame and the other end of the lever and movable along the given directions, and a movement control mechanism interposed between the button and the eject bar for controlling the button to cyclically move among a first position where the push-side end projects from the given wall to a small degree, a second position where the push-side end projects from the given wall to the smallest a degree, and a third position where the push-side end projects from the given wall to the greatest degree, the movement control mechanism transmitting the movement of the button to the eject bar when the button moves from the third position to the second position.

DESCRIPTION OF THE PREFERRED EMBODIMENT

Figure 15:
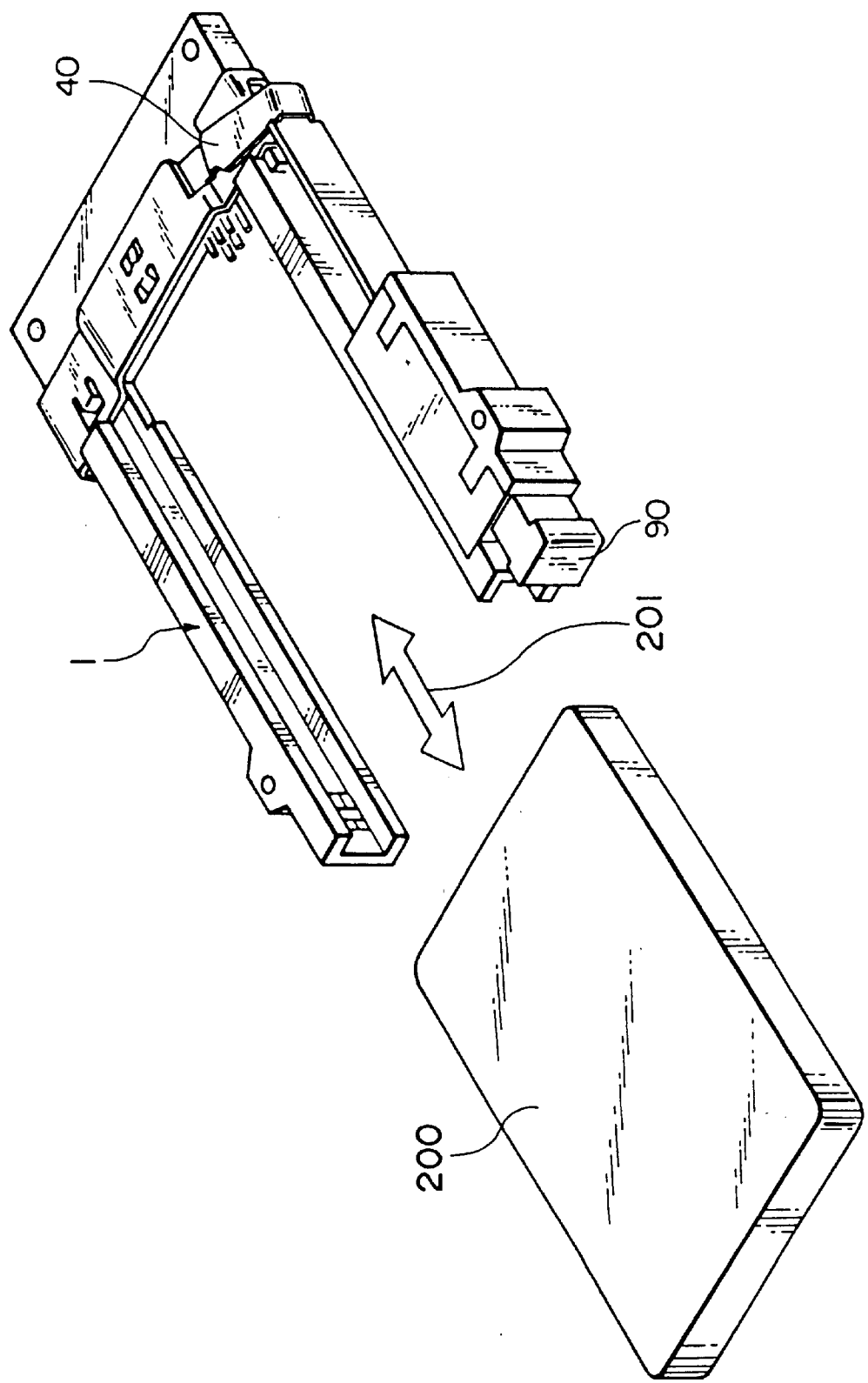
FIG. 15 is a perspective view showing a card connector according to another embodiment of the present invention.
Figure 16:
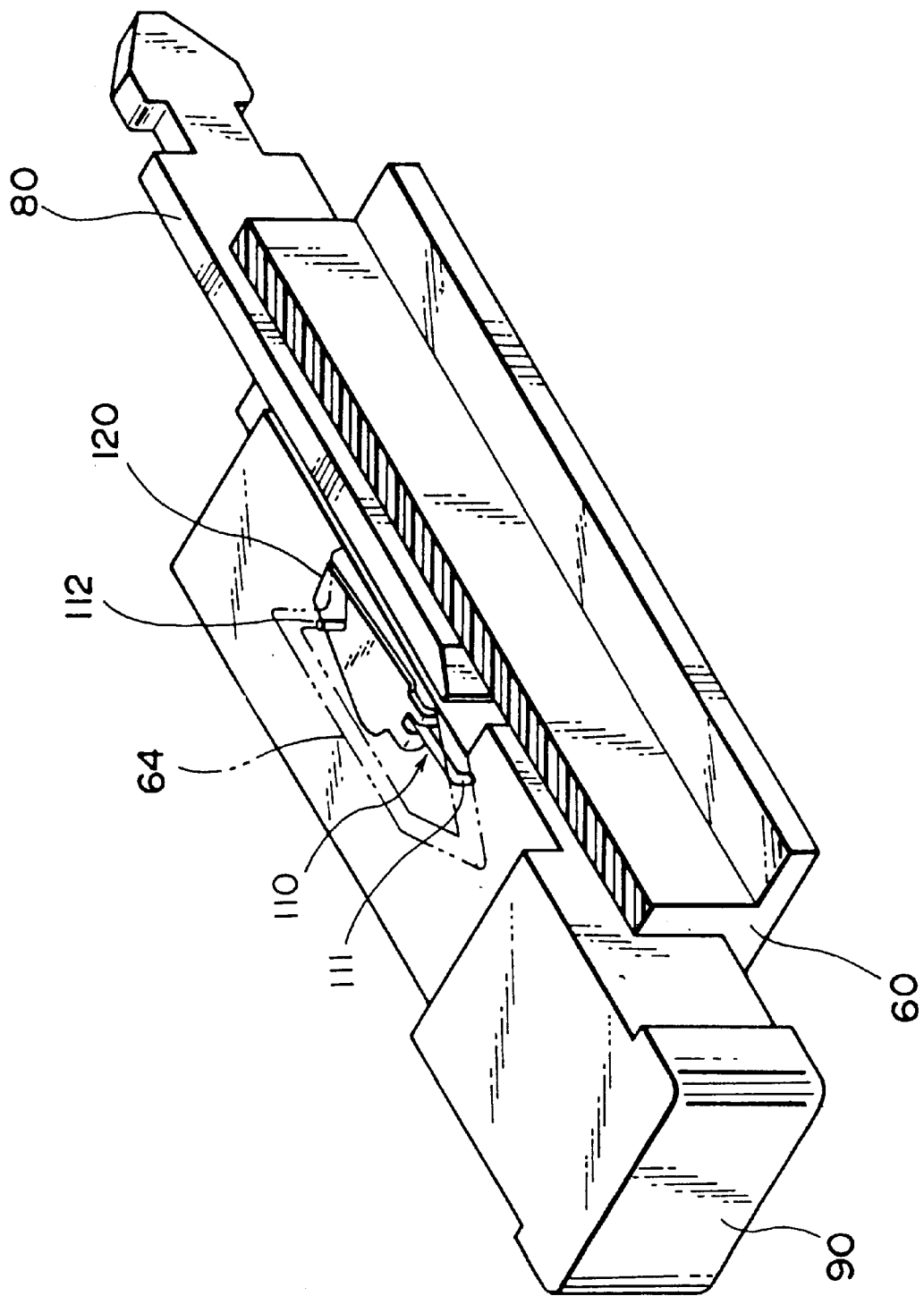
FIG. 16 is a partly cut-out perspective view, as seen from a rear side, of an eject mechanism included in the card connector of FIG. 15, wherein a connection object is loaded.
Figure 17:
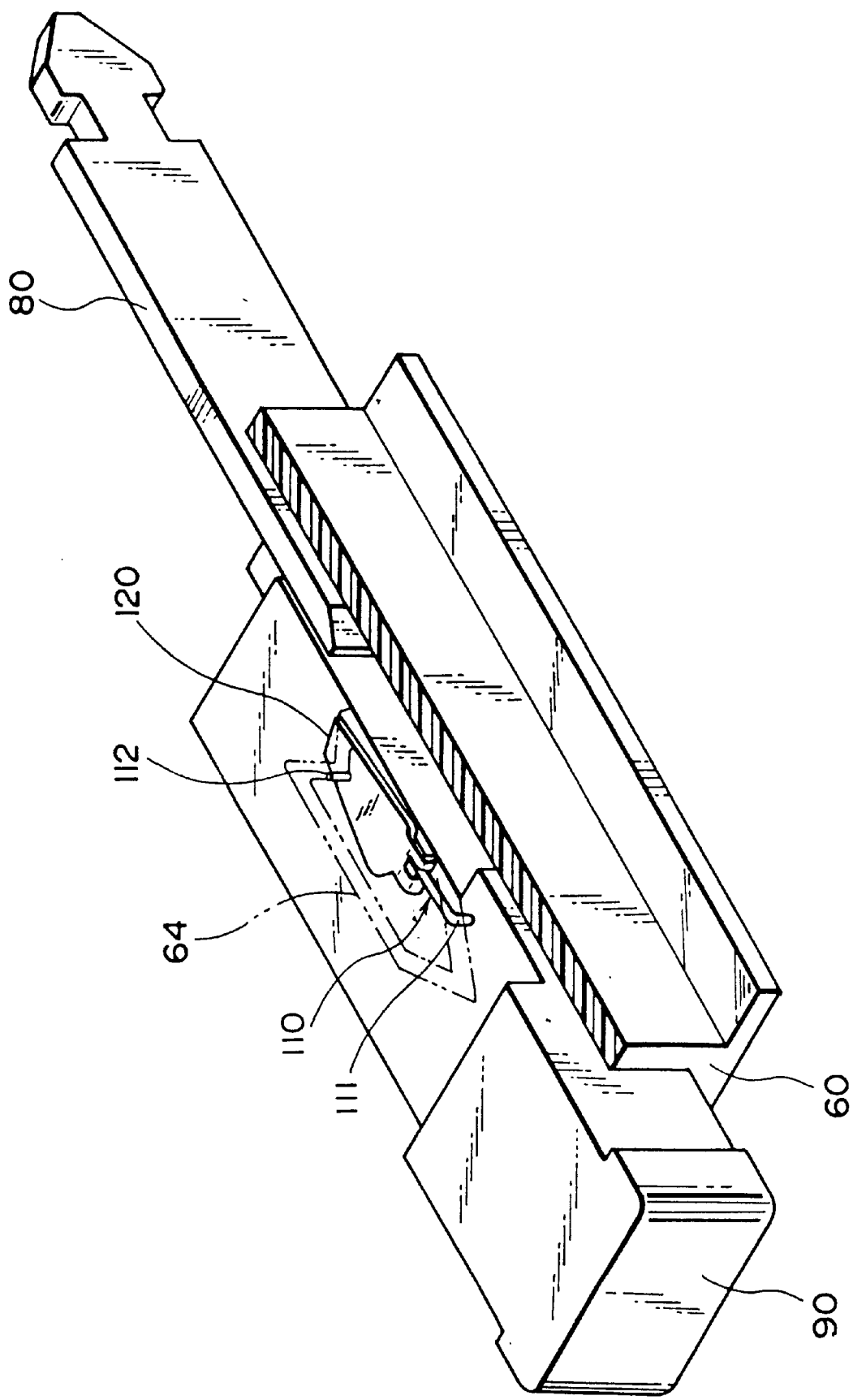
FIG. 17 is a partly cut-out perspective view, as seen from a rear side, of the eject mechanism of illustrated in FIG. 16, wherein the connection object is not loaded.

Referring to FIGS. 15 to 17, description will be made as regards a card connector according to an embodiment of this invention. The card connector is designated by a reference numeral 1 and allows a card-shaped connection object 200, such as a PC card, to be loaded and unloaded in given directions or a first and a second directions 201. In the card connector 1, an eject mechanism is used for unloading the connection object 200 and comprises, as shown in FIGS. 16 and 17, a button 90 movable in the directions 201, an eject bar 80 movable along the directions 201 and coupled to an unloading lever 40, and a movement control mechanism interposed between the button 90 and the eject bar 80 so as to retain the button 90 in a given position and transmit the movement of the button 90 to the eject bar 80.

The shown movement control mechanism comprises a spring 110 having one end (button engaging portion) 111 pivotally attached to the button 90, a contact plate 120 attached to the spring 110 and intermittently contacting the eject bar 80, and a heart cam 64 for retaining the other end (cam engaging portion) 112 of the spring 110 in given positions and allowing the contact plate 120 to abut the eject bar 80 during movement of the button 90 to a given position. As appreciated, FIG. 16 is an explanatory diagram showing the state wherein the connection object 200 is loaded, while FIG. 17 is an explanatory diagram showing the state wherein the connection object 200 is not loaded.

Figure 1:
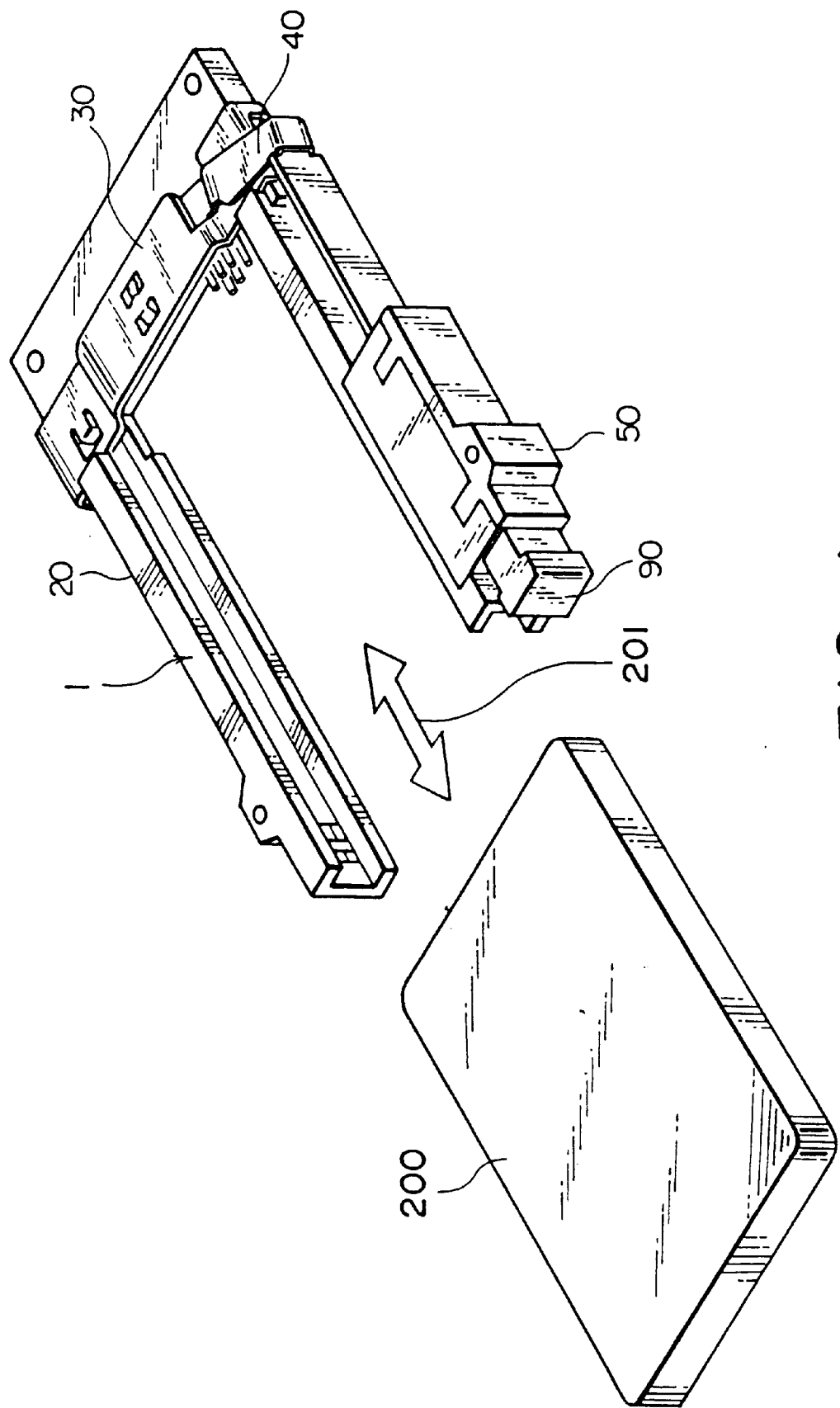
FIG. 1 is a perspective view showing a card connector according to an embodiment of the present invention.
Figure 2:
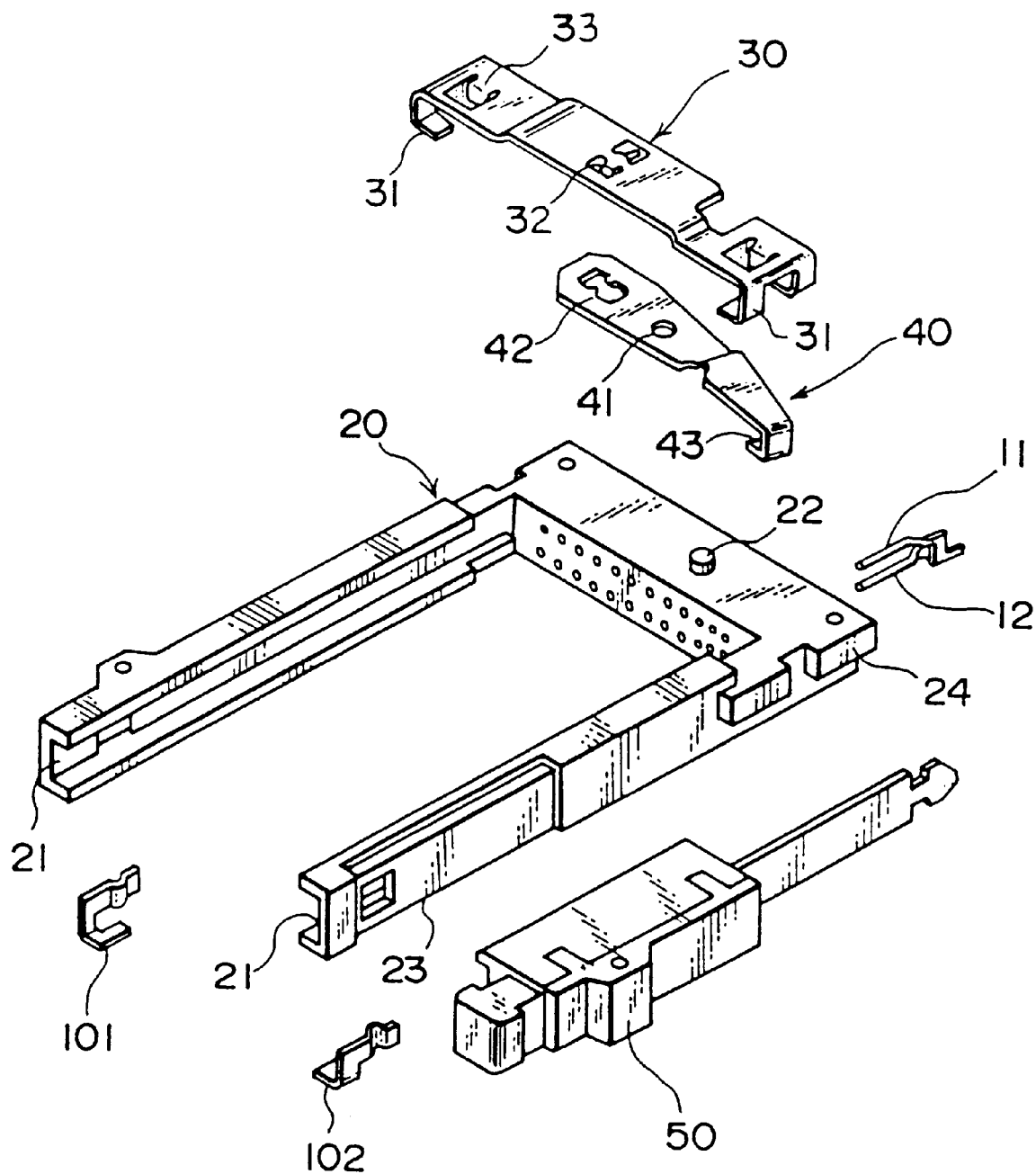
FIG. 2 is an exploded perspective view of the card connector shown in FIG. 1.
Figure 3:
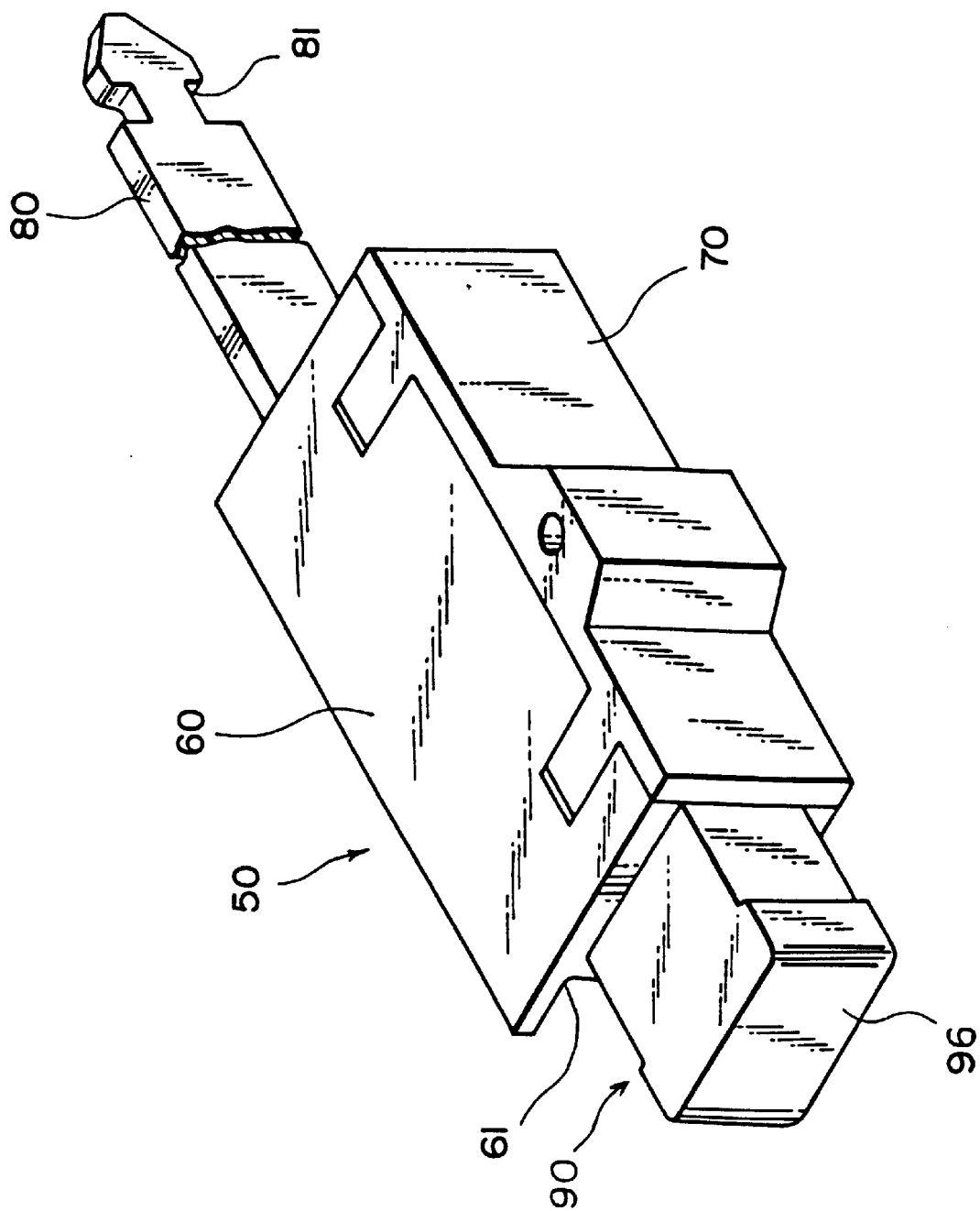
FIG. 3 is a perspective view showing an eject mechanism of the card connector shown in FIG. 1, wherein a button is in an initial position.
Figure 4:
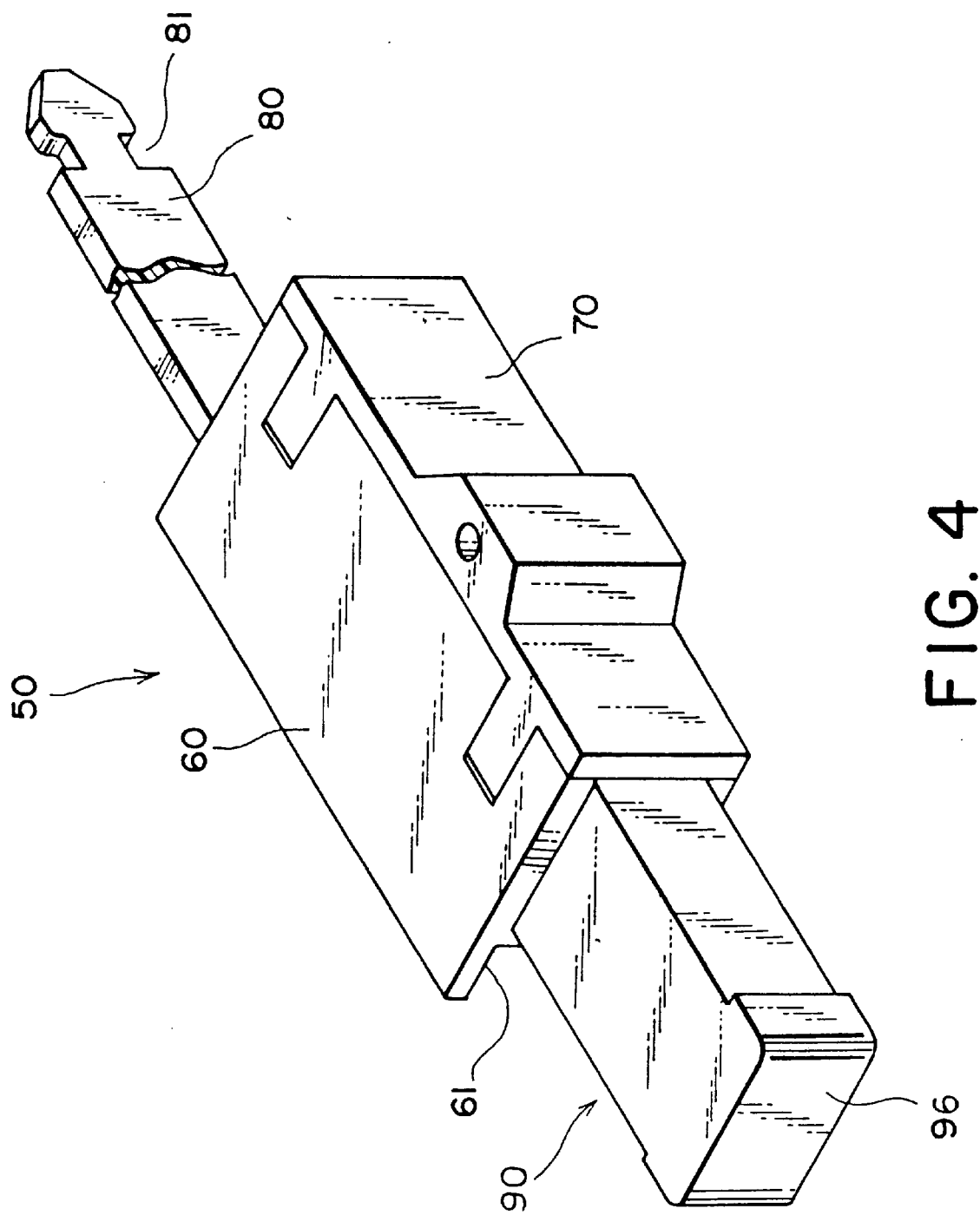
FIG. 4 is a perspective view showing the eject mechanism of the card connector shown in FIG. 1, wherein the button is in a projected position.
Figure 5:
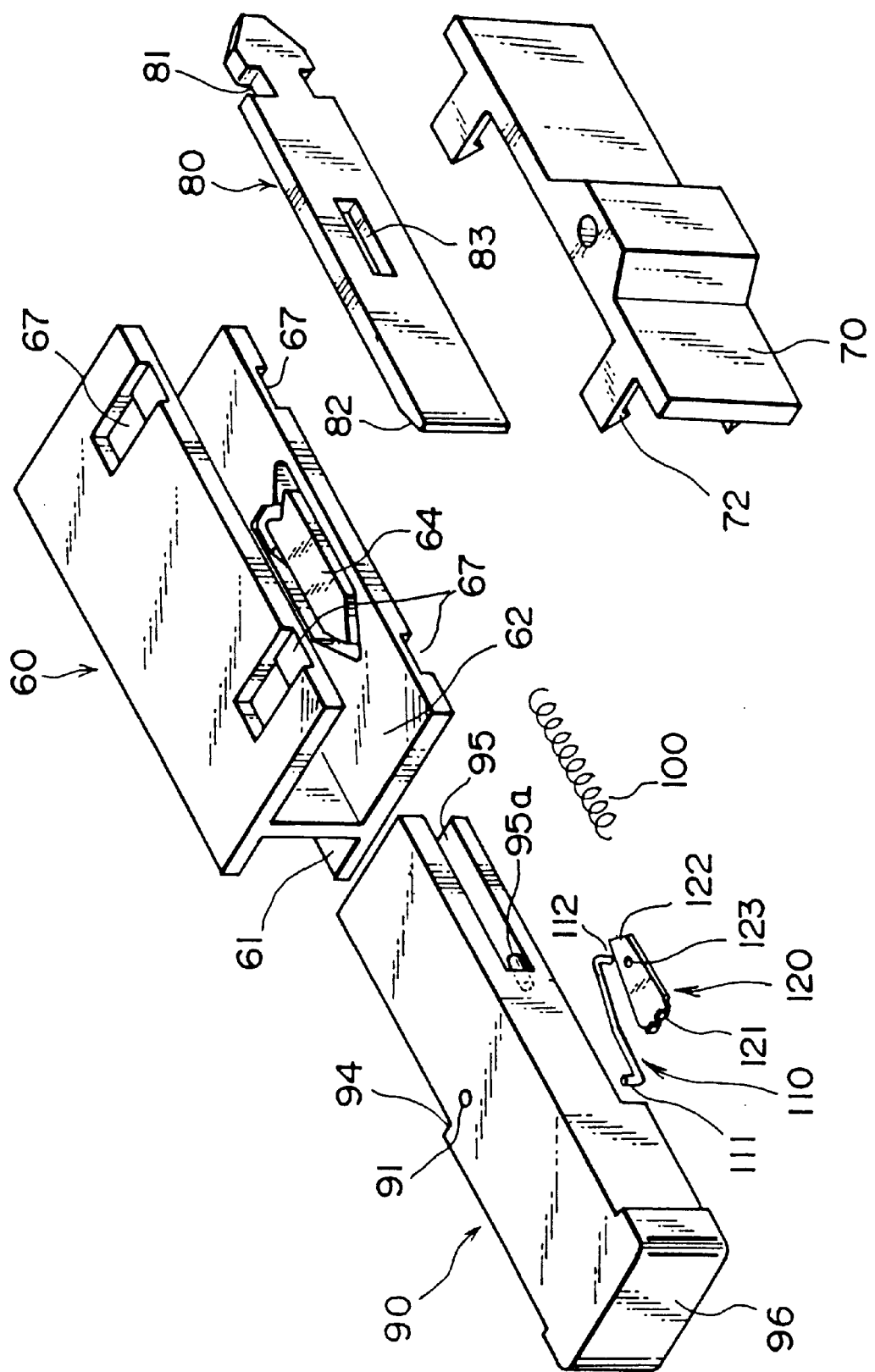
FIG. 5 is an exploded perspective view of the eject mechanism shown in FIGS. 3 and 4.
Figure 6:
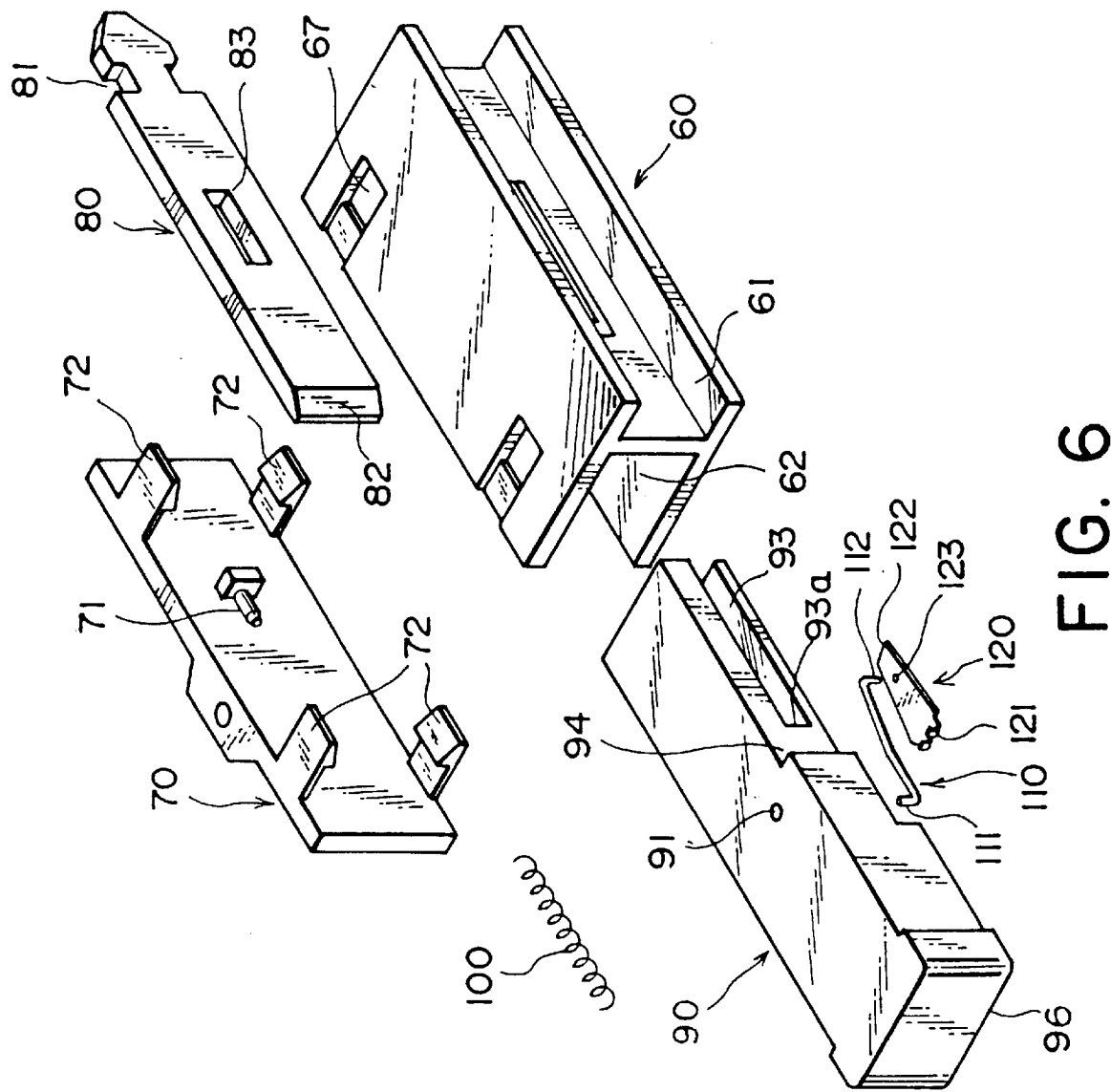
FIG. 6 is an exploded perspective view, as seen from a rear side, of the eject mechanism shown in FIGS. 3 and 4.
Figure 7:
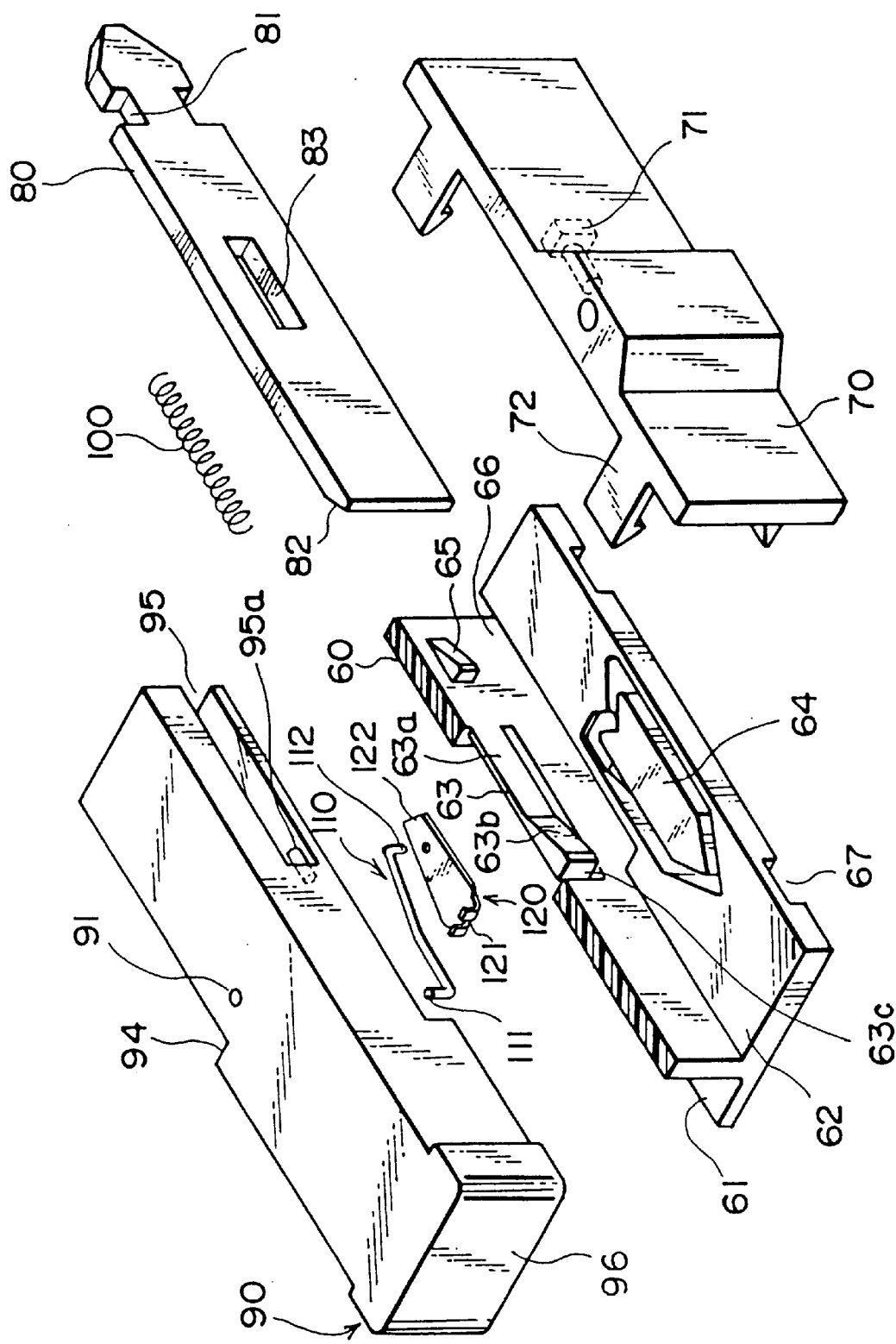
FIG. 7 is a partly cut-out exploded perspective view of the eject mechanism shown in FIGS. 3 and 4.

Turning to FIGS. 1 and 2, the description will be directed to a card connector according to another embodiment of the present invention. Similar parts are designated by like reference numerals. The card connector comprises a frame 20, a plate 30, a lever 40 and an eject mechanism or unit 50.

The frame 20 is made of an insulating material and allows a card-shaped connection object 200 to be inserted or loaded thereinto and released or unloaded therefrom in given directions 201. The frame 20 comprises a pair of guide grooves 21 for guiding the connection object 200 therealong, a rotation shaft 22 for the lever 40, and a mounting portion 23 for the eject mechanism 50. Further, the frame 20 is formed with a pair of stepped portions 24, and provided with a number of conductive contacts 11, 12 in parallel.

The plate 30 is obtained by, for example, pressing a metal plate. The plate 30 is provided on the frame 20 so as to be movable in the directions 201, and arranged to contact with the connection object 200 inserted into the frame 20. The plate 30 has a pair of bent portions 31, an engaging portion 32 relative to the lever 40, and a pair of abutting portions 33 for abutting with an end surface of the connection object 200. By engaging the bent portions 31 of the plate 30 with the stepped portions 24 of the frame 20, the plate 30 is mounted on the frame 20 so as to be movable in the directions 201.

The lever 40 is obtained by, for example, pressing a metal plate. The lever 40 comprises a shaft hole 41 for receiving therein the rotation shaft 22 of the frame 20, an engaging portion 42 relative to the plate 30, and a coupling portion 43 relative to the eject mechanism 50. The lever 40 is turnably or pivotally disposed on the frame 20, and has one end coupled to the plate 30 and the other end coupled to the eject mechanism 50. In FIG. 2, numerals 101 and 102 denote ground terminals for the escape of undesired current inside the connection object 200 to the exterior thereof. The ground terminals 101 and 102 are attached to the tip portions of the frame 20.

Referring to FIGS. 3 to 7, the eject mechanism 50 comprises a casing 60, a cover 70, a button 90 movable along the directions 201, a coil spring (urging member) 100 for biasing the button 90, an eject bar 80 movable along the directions 201 and coupled to the other end of the lever 40, a spring 110 having one end (button engaging portion) 111 pivotally attached to the button 90, and a contact plate 120. The eject mechanism 50 is formed into a unit by the casing 60 and the cover 70.

The casing 60 has a fixing groove 61 at one side of an intermediate wall, and a button slide groove 62 at the other side thereof. The casing 60 is fixed to the frame 20 by fitting the fixing groove 61 over the mounting portion 23 of the frame 20. The button slide groove 62 receives therein the button 90 so as to be movable in the directions 201. Cover fixing grooves 67 are formed on the upper and lower sides of the casing 60. Further, the intermediate wall of the casing 60 is formed with a stopper 63 having a plate spring 63a, a tapered portion 63b and an end portion 63c. The end portion 63c can be projected or retreated relative to a later-described stopper groove 93 of the button 90 via the button slide groove 62, and is projected into the stopper groove 93 when the connection object 200 is not loaded.

Figure 8:
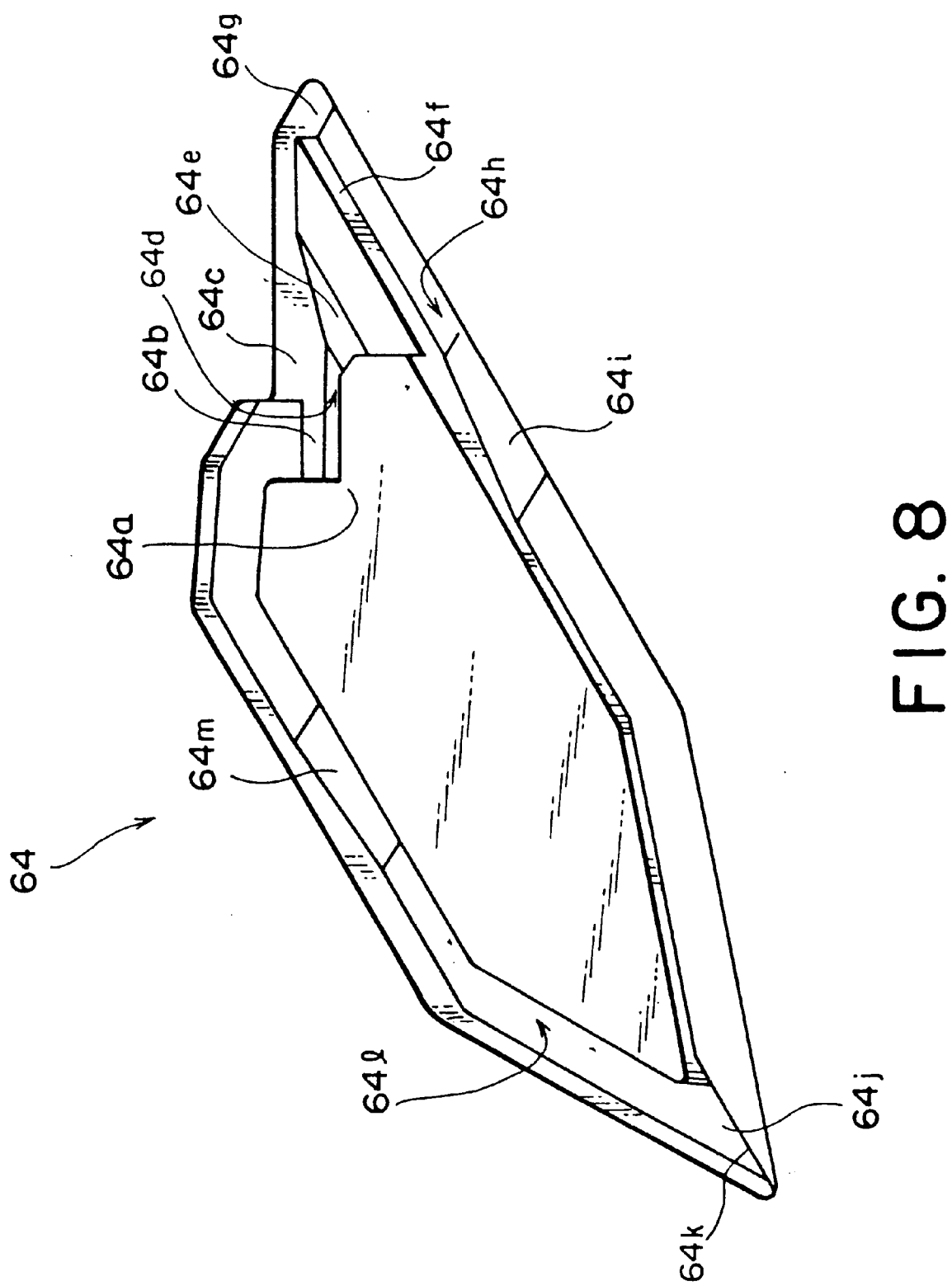
FIG. 8 is an enlarged perspective view of a heart cam of the eject mechanism shown in FIGS. 3 and 4.

On the bottom of and in the interior of the button slide groove 62, a heart cam 64 is formed. As shown in FIG. 8, the heart cam 64 has a recessed portion 64a, a first step 64b, a first wall 64c, a first groove 64d, a first inclined portion 64e, a second step 64f, a second wall 64g, a second groove 64h, a second inclined portion 64i, a third step 64j, a third wall 64k, a third groove 64l and a third inclined portion 64m. Since the heart cam 64 is formed on the casing 60, it is fixed relative to the frame 20. The heart cam 64 receives a later-described cam engaging portion 112 of the spring 110 and functions to transfer it in one-way directions and retain it in given positions.

Behind the foregoing stopper 63, an eject bar stopper 65 is provided on the intermediate wall of the casing 60. Further, the bottom of the casing 60 is formed with an eject bar slide groove 66 extending along the intermediate wall of the casing 60. The eject bar slide groove 66 receives the eject bar 80 so as to be movable in the directions 201.

The cover 70 is formed with a coil spring retaining horn 71 and fixing pawls 72. By fitting the fixing pawls 72 into the cover fixing grooves 67 of the casing 60, the cover 70 is fixed to the casing 60. This prevents the button 90 from falling off from the button slide groove 62.

The button 90 has a spring fixing hole 91, the stopper groove 93, a step 94 and a coil spring receiving groove 95. As appreciated, one end of the button 90 is formed as a push-side end 96 which is pushed by a finger. The stopper groove 93 receives the end portion 63c of the stopper 63 so as to be movable relative to the stopper groove 93 in the directions 201, while having a stopper surface 93a which engages with the end portion 63c of the stopper 63, when the connection object 200 is not loaded in the frame 20 and the button 90 is in a first position, for prohibiting the movement of the button 90 to a second position, which will be described later in detail. Further, a coil spring retaining horn 95a is provided on the bottom of the coil spring receiving groove 95.

The coil spring 100 is disposed between the coil spring retaining horn 71 of the cover 70 and the coil spring retaining horn 95a of the button 90. The coil spring 100 produces an urging force in a direction to project the push-side end 96 of the button 90 from a given wall, for example, a casing of an electronic device (not shown).

The eject bar 80 is provided with a coupling portion 81, a tapered portion 82 and a stopper groove 83. The eject bar 80 is coupled to the lever 40 through engagement between the coupling portion 81 thereof and the coupling portion 43 of the lever 40. The eject bar 80 is movable within the eject bar slide groove 66 of the casing 60 and prevented from falling off from the casing 60 through engagement between the eject bar stopper 65 and one end of the stopper groove 83.

When the connection object 200 is loaded into the L frame 20, the eject bar 80 is moved toward the end portion 63c of the stopper 63 so as to engage with the end portion 63c to force it out of the stopper groove 93 of the button 90, in response to the movement of the plate 30 and the lever 40. On the other hand, when the connection object 200 is unloaded from the frame 20 by pushing the button 90, the eject bar 80, following the movement of the button 90, moves in a direction away from the end portion 63c of the stopper 63 so as to release the engagement with the end portion 63c.

The spring 110 is made of a metal rod having flexibility. The spring 110 is bent at its both ends to provide the button engaging portion 111 and the cam engaging portion 112, respectively. The spring 110 is pivotally attached to the button 90 at the button engaging portion 111. In the assembled state of the card connector 1, the cam engaging portion 112 is inserted into the groove of the heart cam 64 and urged toward the bottom of the groove.

The contact plate 120 has a bifurcate portion 121, an end portion 122 and a spring hole 123. In the assembled state of the card connector 1, the spring 110 is fitted into the bifurcate portion 121 and the cam engaging portion 112 of the spring 110 is fitted into the spring hole 123, so that the contact plate 120 is attached to the spring 110.

The spring 110, the eject bar 80, the contact plate 120 and the heart cam 64 cooperatively constitute a movement control mechanism. The movement control mechanism functions to cyclically retain the button 90 in the first position where the push-side end 96 of the button 90 projects from the given wall to a small degree, in the second position where the push-side end 96 projects from the given wall to the smallest degree, and in a third position where the push-side end 96 projects from the given wall to the greatest degree, and further functions to transmit the movement of the button 90 to the eject bar 80 when the button 90 moves from the third position to the second position.

The stopper 63 of the casing 60, the eject bar 80 and the stopper groove 93 of the button 90 cooperatively constitute a stopper mechanism. When the button 90 is pushed for moving it from the first position to the second position while the connection object 200 is not loaded in the frame 20, the stopper mechanism functions prohibits the movement of the button 90 so as to retain the button 90 in the first position.

Now, an operation of the card connector 1 according to this embodiment will be described.

First, when the connection object 200 is loaded into the card connector 1, the end surface of the connection object 200 abuts the abutting portions 33 of the plate 30 so that the plate 30 moves along with the connection object 200. At this time, the engaging portion 42 of the lever 40 moves in the same direction as the plate 30 due to the engagement between the engaging portion 42 of the lever 40 and the engaging portion 32 of the plate 30. As a result, the lever 40 turns about the rotation shaft 22 of the frame 20. Thus, the coupling portion 43 of the lever 40 moves in a direction opposite to a loading direction of the connection object 200 relative to the card connector 1, that is, in an unloading direction of the connection object 200 relative to the card connector 1.

On the other hand, for unloading the connection object 200 from the card connector 1, the coupling portion 43 of the lever 40 is pushed in the loading direction by operating the eject mechanism 50. Then, since the lever 40 turns about the rotation shaft 22, the engaging portion 42 of the lever 40 causes the plate 30 to move in the unloading direction via the engaging portion 32 of the plate 30. Thus, the abutting portions 33 of the plate 30 presses the connection object 200 to unload it from the frame 20.

Figures 9A, 9B, 9C, 9D, 9E, 9F, 9G, 9H:
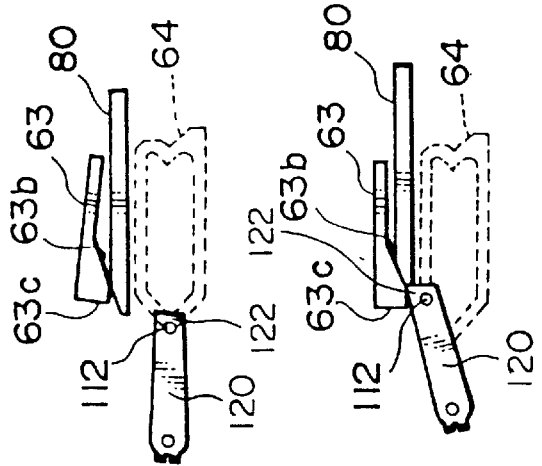
FIGS. 9A to 9H are diagrams for explaining an operation of the card connector shown in FIG. 1.
Figure 10:
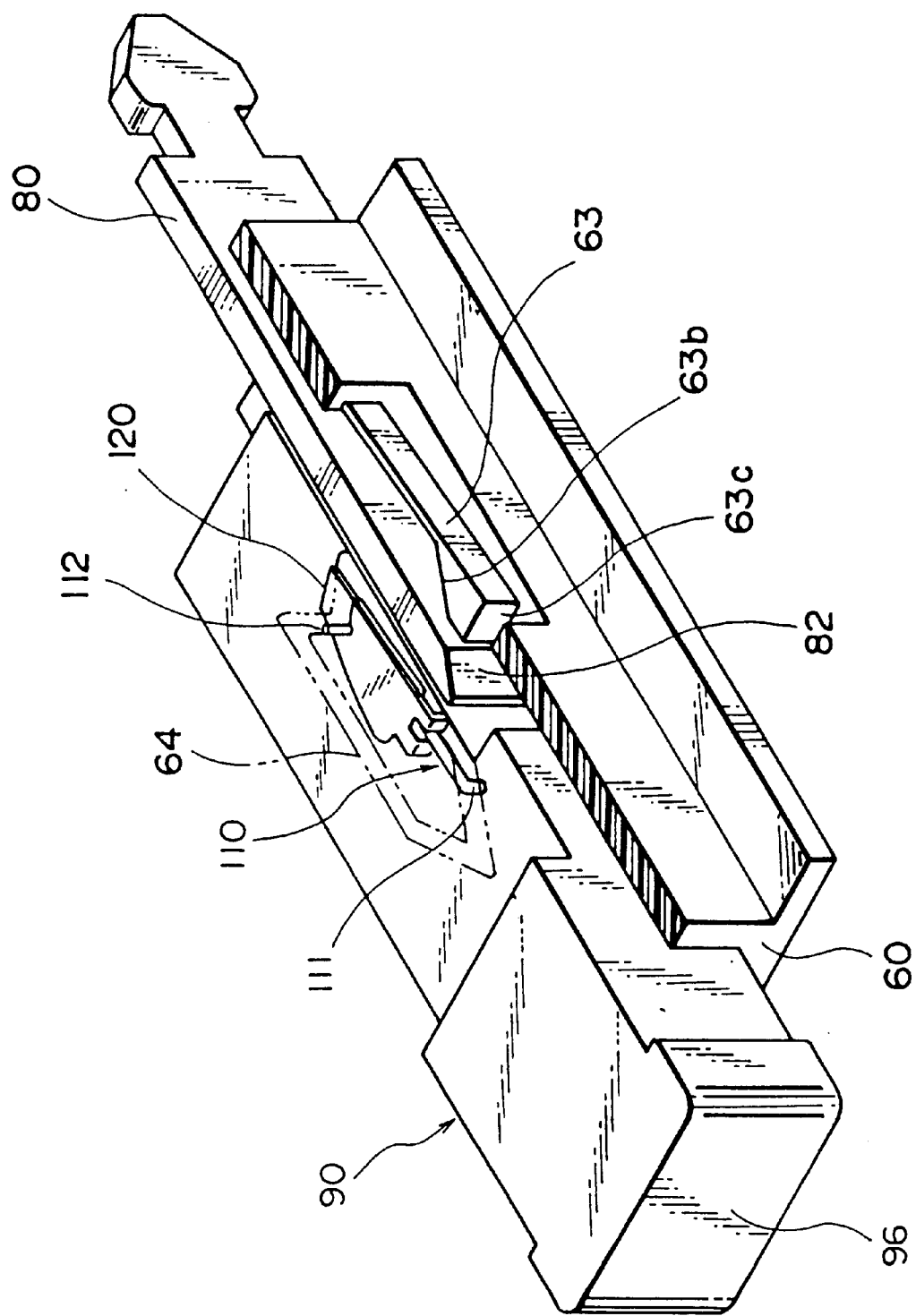
FIG. 10 is a partly cut-out perspective view, as seen from a rear side, of the eject mechanism shown in FIGS. 3 and 4, wherein the button is in the initial position.
Figure 11:
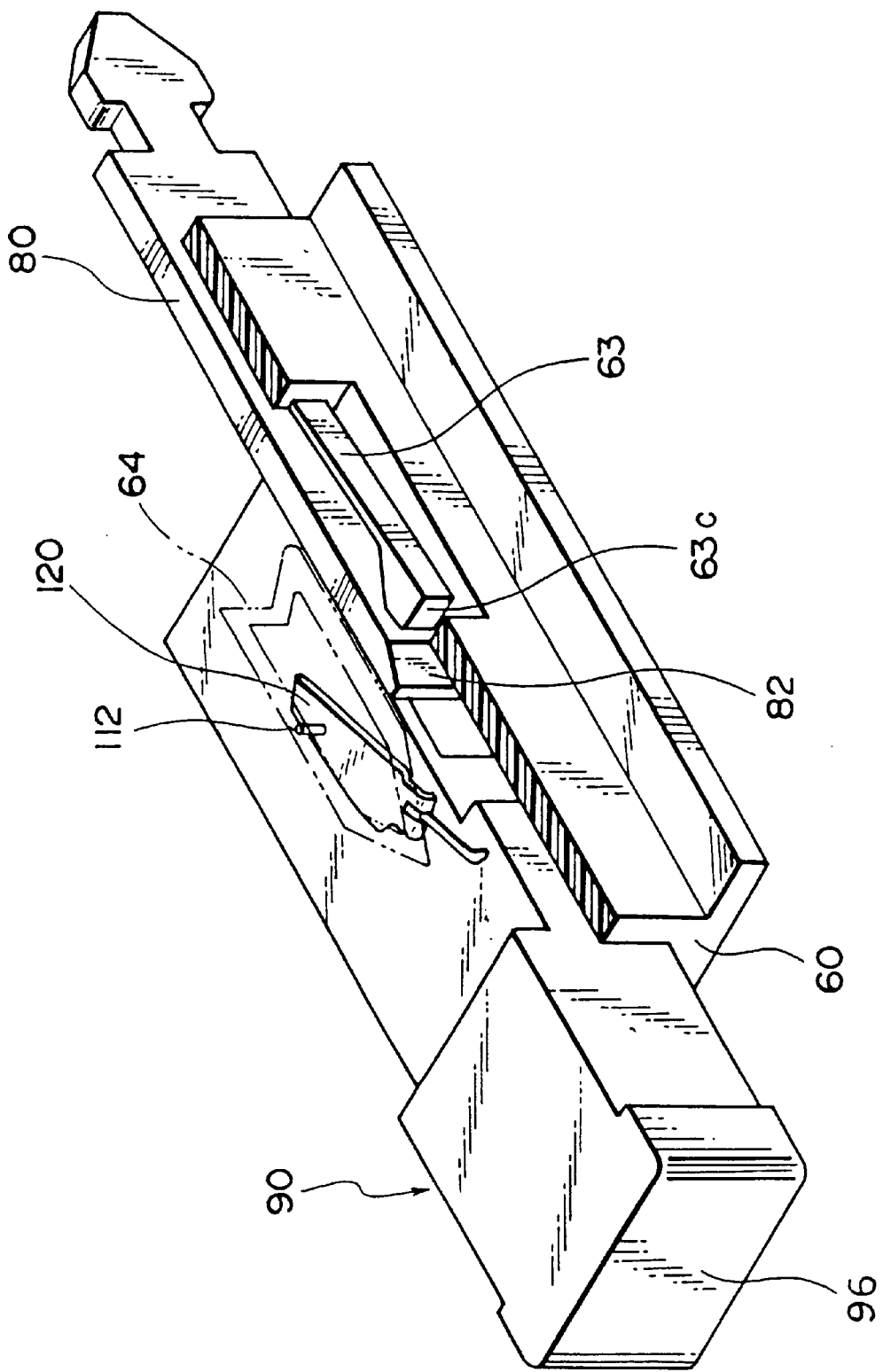
FIG. 11 is a partly cut-out perspective view, as seen from a rear side, of the eject mechanism shown in FIGS. 3 and 4, wherein the button is being projected.

Referring now to FIGS. 9A to 14, the operation of the card connector 1 according to this embodiment will be described in more detail. First, when the connection object 200 is loaded while the button 90 is in the first position (initial position), the state becomes as shown in FIGS. 9A and 10. In this state, due to the spring force of the coil spring 100, the cam engaging portion 112 of the spring 110 is received in the recessed portion 64a of the heart cam 64 and retained in a position corresponding to the first position of the button 90. Since the eject bar 80 is pressed to move toward the push-side end 96 of the button 90 due to the rotation of the lever 40, the eject bar 80 enters between the stopper groove 93 of the button 90 and the stopper 63 so as to prohibit engagement between the button 90 and the stopper 63.

When the button 90 is pushed in this state, the spring 110 is also pushed along with the button 90 so that a pivotal motion of the spring 110 is caused with respect to the button engaging portion 111 due to the function of the heart cam 64. Specifically, when the button 90 is pushed, since there exists the first step 64b, the cam engaging portion 112 in the recessed portion 64a moves in the first groove 64d along the first wall 64c, rides across the first inclined portion 64e and over the second step 64f to reach the second wall 64g, and retained in a position corresponding to the second position of the button 90. This state is shown in FIG. 9B.

Subsequently, when the force to push the button 90 is relaxed, the button 90 is pushed back by the force of the coil spring 100. At this time, the cam engaging portion 112 of the spring 110 moves in the second groove 64h of the heart cam 64 and reaches the third step 64j via the second inclined portion 64i, and retained in a position corresponding to the third position of the button 90. Thus, the button 90 projects to the greatest degree and retained in the third position. These states are shown in FIGS. 9C to 9E.

When the button 90 is pushed again while the button 90 is in the third position, the cam engaging portion 112 of the spring 110 moves in the third groove 64l and passes the third inclined portion 64m. While moving in the bent third groove 64l, the cam engaging portion 112 of the spring 110 deviates in a direction perpendicular to the directions 201 so that the contact plate 120 rotates along with the spring 110. Due to this rotation, the end portion 122 of the contact plate 120 engages with an end of the tapered portion 82 of the eject bar 80. Accordingly, when the button 90 is further pushed, the eject bar 80 is also pushed by the contact plate 120. This state is shown in FIGS. 9F and 12.

Figure 12:
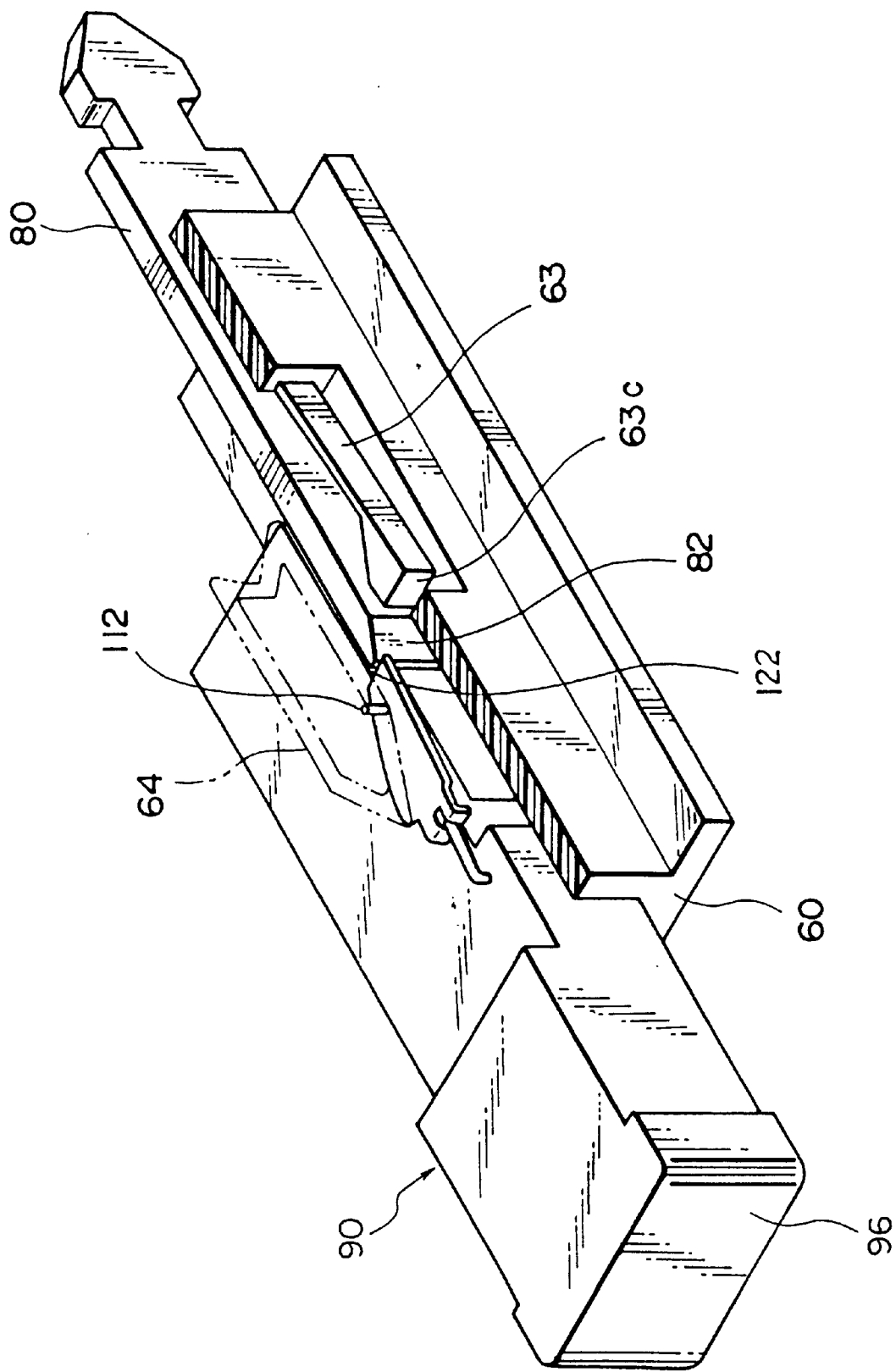
FIG. 12 is a partly cut-out perspective view, as seen from a rear side, of the eject mechanism shown in FIGS. 3 and 4, wherein the button is being pushed again.
Figure 13:
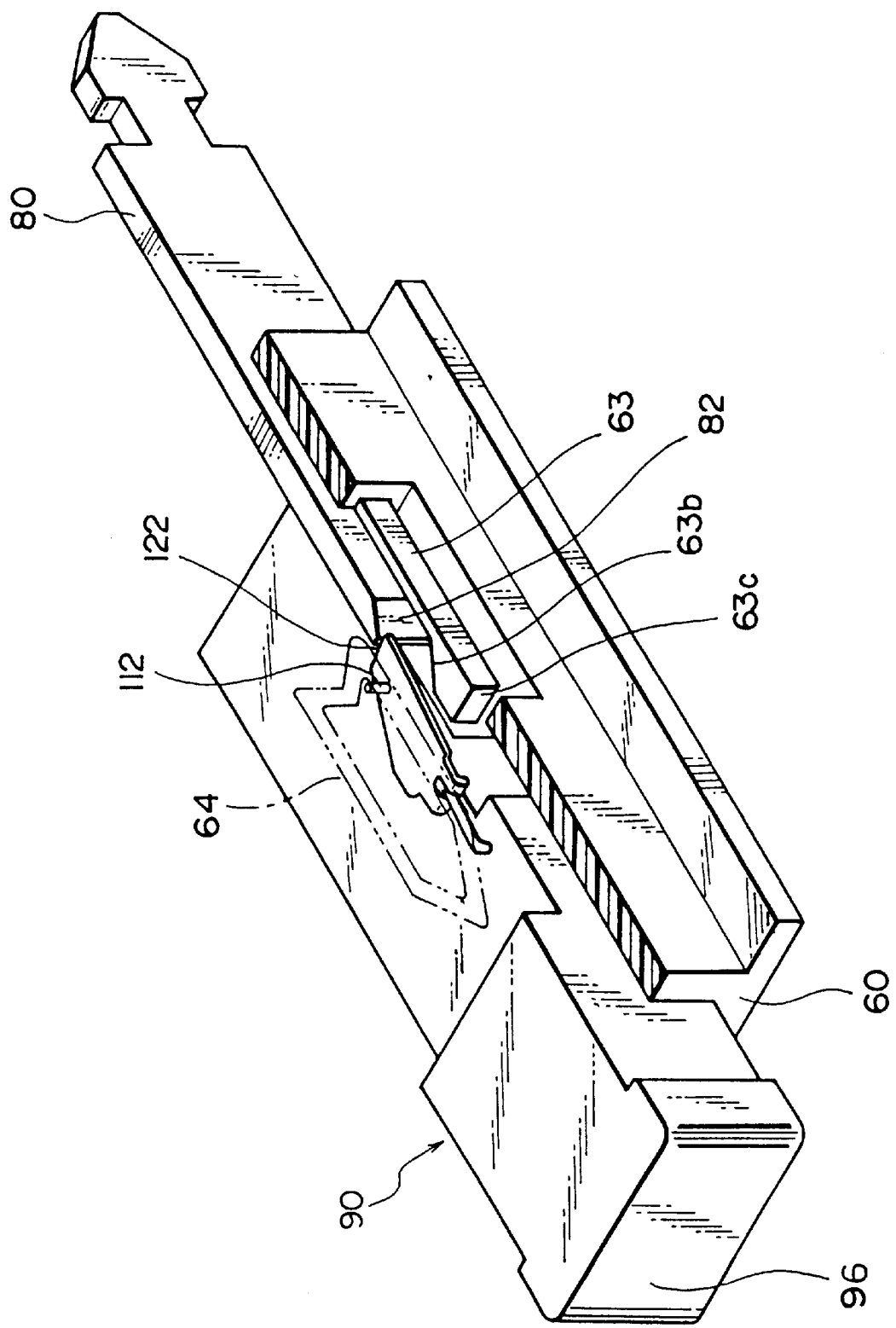
FIG. 13 is a partly cut-out perspective view, as seen from a rear side, of the eject mechanism shown in FIGS. 3 and 4, wherein the button is being pushed again.

When the button 90 is further pushed from the state shown in FIGS. 9F and 12, the eject bar 80 disengages from the end portion 63c of the stopper 63 as shown in FIGS. 9G and 13. At this time, since the stopper 63 returns to the initial state, the end portion 63c enters the stopper groove 93 of the button 90 via the button slide groove 62 of the casing 60.

Figure 14:
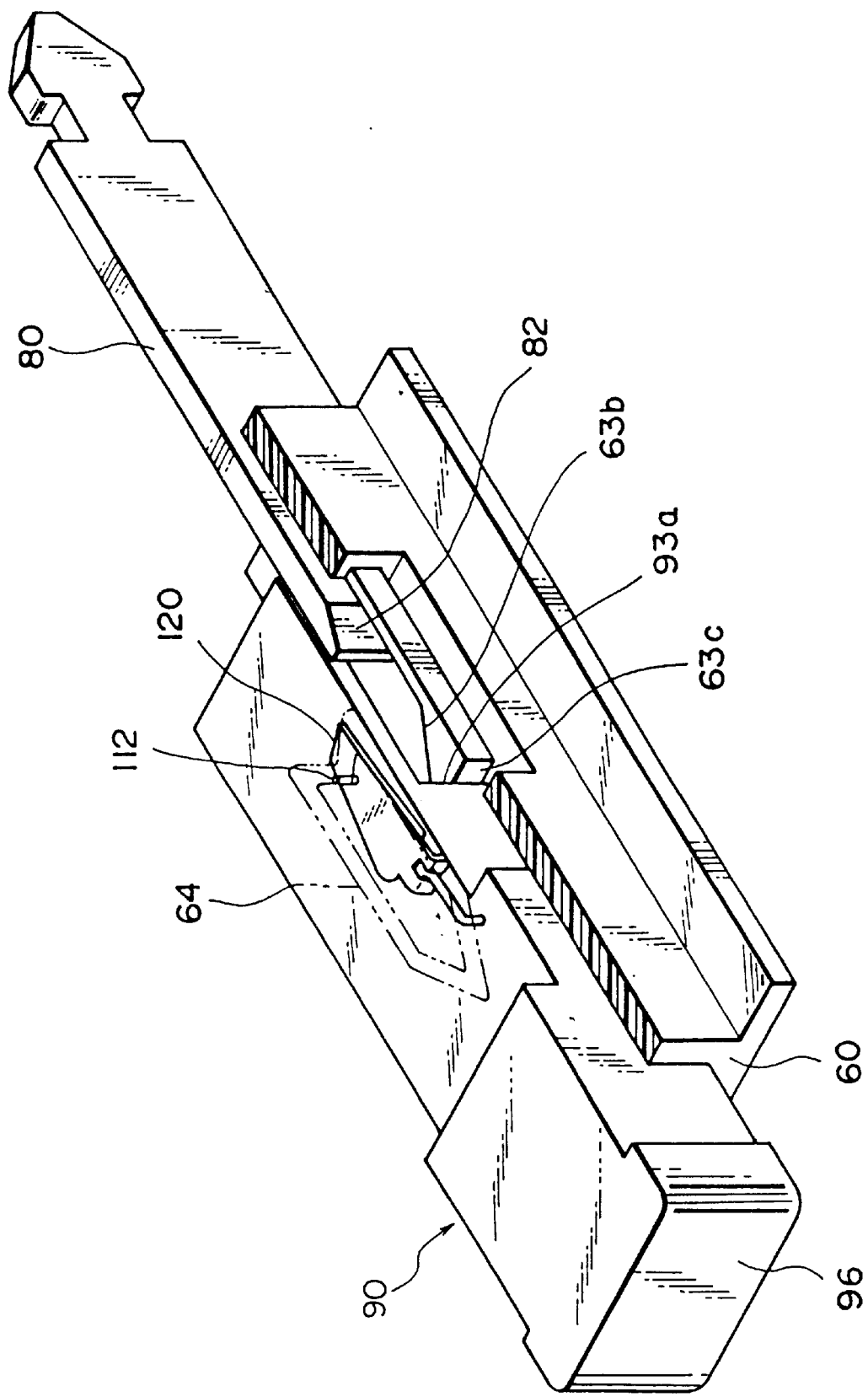
FIG. 14 is a partly cut-out perspective view, as seen from a rear side, of the eject mechanism shown in FIGS. 3 and 4, wherein the button is in the initial position.

Further, since the eject bar 80 is pushed in the foregoing loading direction by the movement of the button 90, the lever 40 turns to move the plate 30 in the foregoing unloading direction so that the connection object 200 is unloaded. When the finger disengages from the button 90 in this state, the cam engaging portion 112 of the spring 110 enters the recessed portion 64a due to the biasing force of the coil spring 100 so that the button 90 returns to and retained in the first position, as shown in FIGS. 9H and 14. A combination of the heart cam 64, the spring 110, and the contact plate 120 is referred to as a position control mechanism.

Even if the button 90 is pushed in this state, since the end portion 63c of the stopper 63 abuts against the stopper surface 93a of the stopper groove 93, the button 90 can not be depressed. Thus, the foregoing eject operation can not be carried out. The stopper 63 will be referred to as an inhibiting mechanism.

On the other hand, when the connection object 200 is loaded again in this state, the plate 30 is pushed to turn the lever 40 so as to move the eject bar 80 in the unloading direction. Then, the tapered portion 82 of the eject bar 80 presses the tapered portion 63b of the stopper 63 to bring the stopper 63 into the displaced state from the initial state. Thus, the end portion 63c of the stopper 63 moves out of the stopper groove 93 of the button 90 to realize the state shown in FIG. 10. In this state, the eject operation can be carried out by pushing the button 90. In this event, a combination of the plate 30, the lever 40, and the eject bar 80 will be referred to as a releasing mechanism.

In the card connector according to this embodiment, even when the connection object 200 is loaded or inserted, the position of the button 90 is not changed. When unloading the connection object 200, by pushing the button 90 and then disengaging the finger from the button 90, the button 90 is projected. Then, by pushing again the projected button 90, the connection object 200 is unloaded. After the unloading, the button 90 returns to the initial position. Further, although the button 90 is projected by pushing the button 90 while the connection object 200 is loaded, the button 90 is not operated and thus not projected even by pushing the button 90 while the connection object 200 is not loaded.

While the present invention has thus far been described in conjunction with a single embodiment thereof, it will readily be possible for those skilled in the art to put this invention into practice in various other manners.

What is claimed is:

1. A card connector for connecting a card-shaped connection object which is loaded into said connector in a first direction, said connector comprising:
   a frame for receiving said connection object;
   a button coupled to said frame and operated to move in said first direction for causing said connection object to be unloaded from said connector; and
   a position control mechanism connected to said frame and said button for controlling a position of said button so that said button is cyclically movable among a first, a second, and a third position, said first position being between said second and said third positions in said first direction.

2. A card connector as claimed in claim 1, further comprising an urging member connected to said button for urging said button towards said third position in a second direc tion opposite to said first direction.

3. A card connector as claimed in claim 1, further comprising:
   a plate coupled to said frame so as to be movable in said first direction and a second direction opposite to said first direction, said plate being brought into contact with said connection object that is loaded in said connector;
   a lever having a first end portion, a second end portion coupled to said plate, and an intermediate portion between said first and said second end portions and pivotally connected to said frame; and
   an eject bar coupled to said frame so as to be movable in said first and said second directions and connected to said first end portion of the lever, said eject bar being engaged with said button in said first and said second directions so that said eject bar is moved in said first direction to make said plate eject said connection object from said connector when said button is moved from said third position to said first position and that said eject bar is moved in said second direction to make said button move from said second position towards said third position when said connection object is loaded into said connector.

4. A card connector as claimed in claim 1, further comprising an inhibiting mechanism connected to said frame and said button for inhibiting movement of said button at said first position in said first direction only when said connection object is not loaded in said connector.

5. A card connector as claimed in claim 4, further comprising a releasing mechanism operatively connected to said inhibiting mechanism for releasing operation of said inhibiting mechanism to enable said button move from said first position to said second position when said connection object is loaded in said connector.

6. A card connector as claimed in claim 4, wherein said inhibiting mechanism comprises:
   a plate spring portion connected to said frame and extending in a second direction, opposite to said first direction, said plate spring portion being elastically bendable; and
   an end portion connected to said plate spring portion for engaging with said button to stop said button at said first position in a condition where said eject bar is moved in said first direction.

7. A card connector as claimed in claim 6, further comprising an eject bar coupled to said frame so as to be movable in said first and said second directions, said eject bar being engaged with said button in said first and said second directions so that said eject bar is moved in said first direction to eject said connection object from said connector when said button is moved from said third position towards said first position and that said eject bar is moved in said second direction to move said button from said second position towards said third position when said connection object is loaded into said connector, said inhibiting mechanism further comprising a tapered portion connected to said plate spring portion for engaging with said eject bar to release said end portion from said button with an elastic bend of said plate spring portion when said eject bar is moved in said second direction.

8. A card connector comprising:
   a frame allowing a card-shaped connection object to be loaded thereinto and unloaded therefrom in given directions;
   a plate provided on said frame so as to be movable in said given directions and arranged to contact with said connection object;
   a lever provided on said frame so as to be turnable and coupled at one end thereof to said plate; and
   an eject mechanism coupled to said lever,
   said eject mechanism comprising:
      a button movable along said given directions;
      an urging member connected to said button for urging said button so that a push-side end of said button projects from a given wall;
      an eject bar coupled to said frame and the other end of said lever and movable along said given directions; and
      a movement control mechanism interposed between said button and said eject bar for controlling said button to cyclically move among a first position where said push-side end projects from said given wall to a small degree, a second position where said push-side end projects from said given wall to the smallest degree, and a third position where said push-side end projects from said given wall to the greatest degree, said movement control mechanism transmitting the movement of said button to said eject bar when said button moves from said third position to said first position.

9. A card connector as claimed in claim 8, further comprising a stopper mechanism restricting the movement of said button so as to retain said button in said first position when said button is pushed for moving said button from said first position to said second position while said connection object is not loaded in said frame.

10. A card connector as claimed in claim 9, wherein said stopper mechanism comprises:

a stopper formed at a casing;

said eject bar; and a stopper groove being formed at said button, said stopper having an end portion which can be projected into or retreated from said stopper groove and is normally projected into said stopper groove, said eject bar moving toward said end portion of the stopper to engage with said end portion of the stopper so as to force said end portion of the stopper out of said stopper groove when said connection object is loaded into said frame, while said eject bar moves in a direction away from said end portion of the stopper to release engagement with said end portion of the stopper when said connection object is unloaded from said frame, said stopper groove receiving said end portion of the stopper projected into said stopper groove so as to be movable in said given directions relative to said stopper groove, while said stopper groove has a stopper surface which engages with said end portion of the stopper, when said connection object is not loaded in said frame and said button is in said first position, for prohibiting the movement of said button to said second position.

11. A card connector as claimed in claim 8, wherein said movement control mechanism comprises:

a spring having one end pivotally attached to said button;

a contact plate attached to said spring and intermittently abutting said eject bar; and a heart cam fixed to said frame and receiving the other end of said spring, said heart cam transferring said other end of the spring in one-way directions and retaining said other end of the spring in positions corresponding to said first and third positions, respectively, said heart cam causing said contact plate to contact with said eject bar when said button moves from said third position to said second position.

12. A card connector as claimed in claim 8, wherein said eject mechanism comprises:

a casing including a fixing groove for fixation to said frame;

a button slide groove for receiving said button so as to be movable in said given directions;

an eject bar slide groove for receiving said eject bar so as to be movable in said given directions; and a cover for covering said casing so as to prevent said button from falling off from said button slide groove, said eject mechanism being formed into a unit by means of said casing and said cover.

* * * * *